(12) United States Patent
Ebbecke

(10) Patent No.: US 11,984,704 B2
(45) Date of Patent: May 14, 2024

(54) GAIN-GUIDED SEMICONDUCTOR LASER AND METHOD OF MANUFACTURING THE SAME

(71) Applicant: OSRAM OLED GmbH, Regensburg (DE)

(72) Inventor: Jens Ebbecke, Rohr in Niederbayern (DE)

(73) Assignee: OSRAM OLED GMBH, Regensburg (DE)

( * ) Notice: Subject to any disclaimer, the term of this patent is extended or adjusted under 35 U.S.C. 154(b) by 299 days.

(21) Appl. No.: 17/277,023

(22) PCT Filed: Sep. 12, 2019

(86) PCT No.: PCT/EP2019/074362
§ 371 (c)(1),
(2) Date: Mar. 17, 2021

(87) PCT Pub. No.: WO2020/058082
PCT Pub. Date: Mar. 26, 2020

(65) Prior Publication Data
US 2022/0029388 A1 Jan. 27, 2022

(30) Foreign Application Priority Data

Sep. 19, 2018 (DE) .......................... 102018123019.2

(51) Int. Cl.
*H01S 5/22* (2006.01)
*H01S 5/042* (2006.01)
*H01S 5/065* (2006.01)

(52) U.S. Cl.
CPC ............ *H01S 5/221* (2013.01); *H01S 5/0421* (2013.01); *H01S 5/0653* (2013.01); *H01S 5/2215* (2013.01)

(58) Field of Classification Search
CPC .................. H01S 5/2231; H01S 5/2232; H01S 5/22–2277
See application file for complete search history.

(56) References Cited

U.S. PATENT DOCUMENTS 4,514,896 A * 5/1985 Dixon ................... H01S 5/2202
438/501
4,712,220 A * 12/1987 Luft ....................... H01S 5/4031
378/18

(Continued)

FOREIGN PATENT DOCUMENTS

CN 101567417 A * 10/2009 ............. B82Y 20/00
DE 19963807 A 7/2001
(Continued)

OTHER PUBLICATIONS

Japanese Office Action in Japanese Application No. 2021-515084 mailed on May 23, 2022, 18 pages.
(Continued)

*Primary Examiner* — Joshua King
(74) *Attorney, Agent, or Firm* — MH2 TECHNOLOGY LAW GROUP LLP

(57) ABSTRACT

In an embodiment, the gain-guided semiconductor laser includes a semiconductor layer sequence and electrical contact pads. The semiconductor layer sequence includes an active zone for radiation generation, a waveguide layer, and a cladding layer. The semiconductor layer sequence further includes a current diaphragm layer which is electrically conductive along a resonator axis (R) in a central region and electrically insulating in adjoining edge regions. Transverse to the resonator axis (R), the central region includes a width of at least 10 μm and the edge regions includes at least a minimum width. The minimum width is 3 μm or more. Seen in plan view, the semiconductor layer sequence as well as at least one of the contact pads on the semiconductor layer (Continued)

Figure 1:
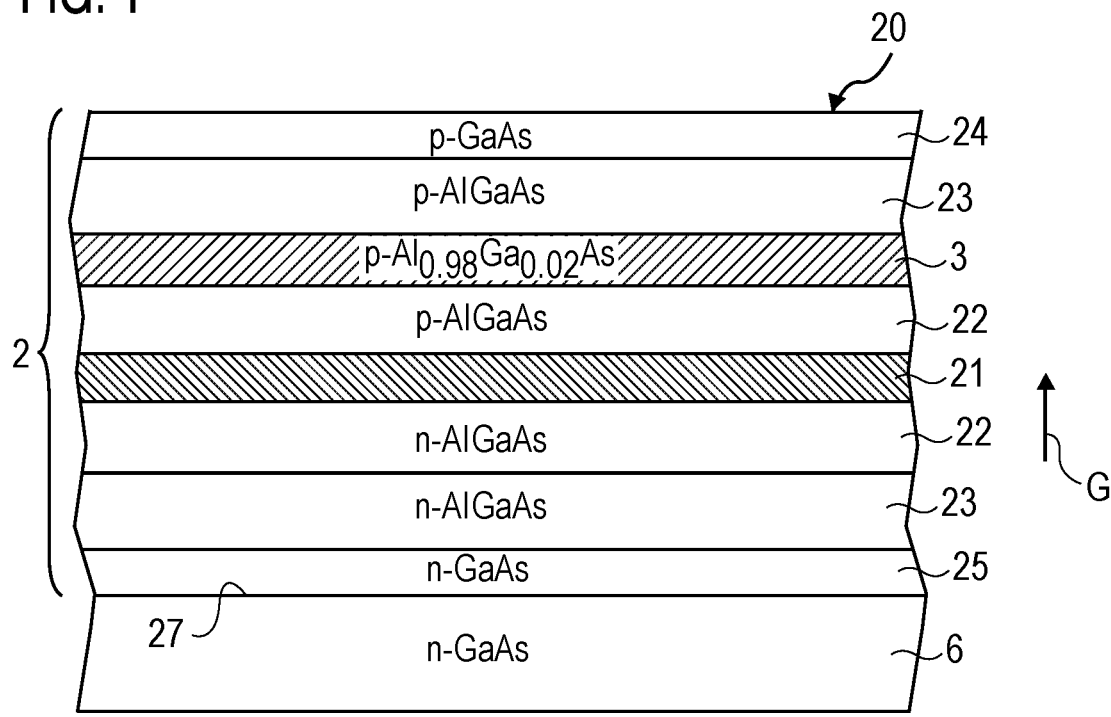

sequence are continuous components extending in the central region as well as on both sides at least up to the minimum width in the direction transverse to the resonator axis (R) adjoining the central region and beyond the central region.

12 Claims, 4 Drawing Sheets

(56) References Cited

U.S. PATENT DOCUMENTS

| | | | | |
|---|---|---|---|---|
| 4,827,483 A * | 5/1989 | Fukuzawa | | H01S 5/16 |
| | | | | 372/45.012 |
| 4,922,499 A * | 5/1990 | Nitta | | H01L 33/0062 |
| | | | | 372/45.01 |
| 4,958,355 A * | 9/1990 | Alphonse | | H01S 5/22 |
| | | | | 372/45.01 |
| 5,247,536 A * | 9/1993 | Kinoshita | | H01S 5/227 |
| | | | | 372/46.01 |
| 5,369,658 A * | 11/1994 | Ikawa | | H01S 5/2231 |
| | | | | 372/45.01 |
| 5,523,256 A * | 6/1996 | Adachi | | H01S 5/2231 |
| | | | | 438/31 |
| 5,886,370 A * | 3/1999 | Sun | | H01S 5/2232 |
| | | | | 257/94 |
| 5,917,847 A | 6/1999 | Sun | | |
| 5,974,069 A * | 10/1999 | Tanaka | | H01S 5/32325 |
| | | | | 372/45.01 |
| 6,044,101 A * | 3/2000 | Luft | | H01S 5/4031 |
| | | | | 372/50.1 |
| 6,195,380 B1 | 2/2001 | Shih et al. | | |
| 6,366,595 B1 * | 4/2002 | Bowler | | H01S 5/22 |
| | | | | 372/46.01 |
| 6,414,976 B1 * | 7/2002 | Hirata | | B82Y 20/00 |
| | | | | 372/45.01 |
| 6,597,717 B1 * | 7/2003 | Kneissl | | H01S 5/34333 |
| | | | | 438/22 |
| 6,608,850 B1 * | 8/2003 | Inaba | | H01S 5/227 |
| | | | | 372/45.01 |
| 6,674,090 B1 * | 1/2004 | Chua | | H01L 29/0649 |
| | | | | 257/E29.02 |
| 8,831,061 B2 * | 9/2014 | Lauer | | H01S 5/1237 |
| | | | | 372/45.01 |
| 2001/0021208 A1 * | 9/2001 | Ueyanagi | | G11B 7/127 |
| 2002/0139989 A1 * | 10/2002 | Matsuyama | | H01S 5/227 |
| | | | | 438/22 |
| 2002/0172249 A1 * | 11/2002 | Chino | | H01S 5/227 |
| | | | | 372/50.1 |
| 2003/0156612 A1 | 8/2003 | O'Gorman et al. | | |
| 2004/0245540 A1 * | 12/2004 | Hata | | H01L 21/0254 |
| | | | | 257/E21.127 |
| 2005/0121682 A1 | 6/2005 | Shigihara | | |
| 2005/0254538 A1 * | 11/2005 | Asatsuma | | H01S 5/2231 |
| | | | | 372/45.01 |
| 2007/0121692 A1 | 5/2007 | Kawakami et al. | | |
| 2009/0092163 A1 | 4/2009 | Hirata et al. | | |
| 2010/0183041 A1 | 7/2010 | Imanishi | | |
| 2013/0223462 A1 | 8/2013 | Olson | | |
| 2014/0098831 A1 | 4/2014 | Shigihara | | |
| 2014/0133507 A1 * | 5/2014 | Hamamoto | | H01S 5/2031 |
| | | | | 372/45.01 |
| 2014/0334508 A1 * | 11/2014 | Lauer | | H01S 5/024 |
| | | | | 372/36 |
| 2015/0194788 A1 | 7/2015 | Mueller et al. | | |
| 2017/0365982 A1 * | 12/2017 | Bachmann | | H01S 5/30 |

FOREIGN PATENT DOCUMENTS

| | | | | |
|---|---|---|---|---|
| DE | 10208463 A | | 9/2003 | |
| DE | 102007051167 A1 | | 3/2009 | |
| DE | 102007052629 A1 * | | 5/2009 | H01S 5/10 |
| DE | 102012106687 A1 | | 2/2014 | |
| DE | 102012110613 A1 * | | 5/2014 | H01S 5/1017 |
| DE | 102013223499 A1 * | | 5/2015 | H01S 5/04254 |
| DE | 102017112242 A1 | | 12/2017 | |
| DE | 102018125496 A1 * | | 4/2020 | H01S 5/0202 |
| EP | 2942848 A1 * | | 11/2015 | H01S 5/065 |
| JP | H077220 A * | | 1/1995 | |
| JP | H0786678 A * | | 3/1995 | |
| JP | H0810778 B2 * | | 1/1996 | |
| JP | 11145567 A | | 5/1999 | |
| JP | H11-274634 A | | 10/1999 | |
| JP | 2000133877 | | 5/2000 | |
| JP | 2001251017 | | 9/2001 | |
| JP | 2002500447 A * | | 1/2002 | |
| JP | 2002134836 A * | | 5/2002 | |
| JP | 2002134836 A | | 5/2002 | |
| JP | 2005142463 | | 6/2005 | |
| JP | 2007165760 A * | | 6/2007 | |
| JP | 2007180522 A | | 7/2007 | |
| JP | 3958837 B2 * | | 8/2007 | B82Y 20/00 |
| JP | 2008066571 | | 3/2008 | |
| JP | 2008066571 A * | | 3/2008 | |
| JP | 2009088425 A | | 4/2009 | |
| JP | 2010171183 A | | 8/2010 | |
| JP | 2011142212 | | 7/2011 | |
| JP | 4771801 B2 * | | 9/2011 | |
| JP | 2014078567 A | | 5/2014 | |
| JP | 5661220 B2 * | | 1/2015 | B82Y 20/00 |
| JP | 2017228772 | | 12/2017 | |
| KR | 100259004 B1 * | | 6/2000 | |
| KR | 1020150098710 A | | 8/2015 | |
| WO | WO-9708793 A1 * | | 3/1997 | H01S 5/028 |
| WO | 0150553 A2 | | 7/2001 | |
| WO | 0213334 A2 | | 2/2002 | |
| WO | 0249168 A2 | | 6/2002 | |
| WO | 2014016024 A1 | | 1/2014 | |
| WO | WO-2016129618 A1 * | | 8/2016 | G02B 6/42 |
| WO | WO-2018011279 A1 * | | 1/2018 | H01S 5/1014 |

OTHER PUBLICATIONS

Choquette et al., "Wet Oxidation of AlGaAs vs. AlAs: A Little Gallium is Good", Conference Proceedings LEOS'96 9th Annual Meeting IEEE Lasers and Electro-Optics Society, 1996.

Kissel et al., "Tailored bars at 976 nm for high-brightness fiber-coupled modules", www.dilas.com, 12 pages.

Heerlein, J., "Single-Mode AlGaAs—GaAs Lasers Using Lateral Confinement by Native-Oxide Layers," IEEE Photonics Technology Letters, Apr. 1998, pp. 498-500, vol. 10, No. 4.

* cited by examiner

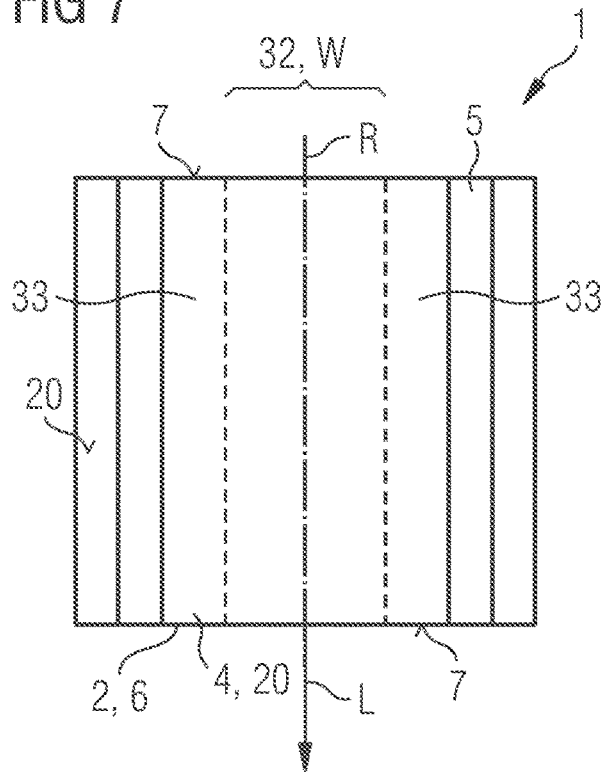
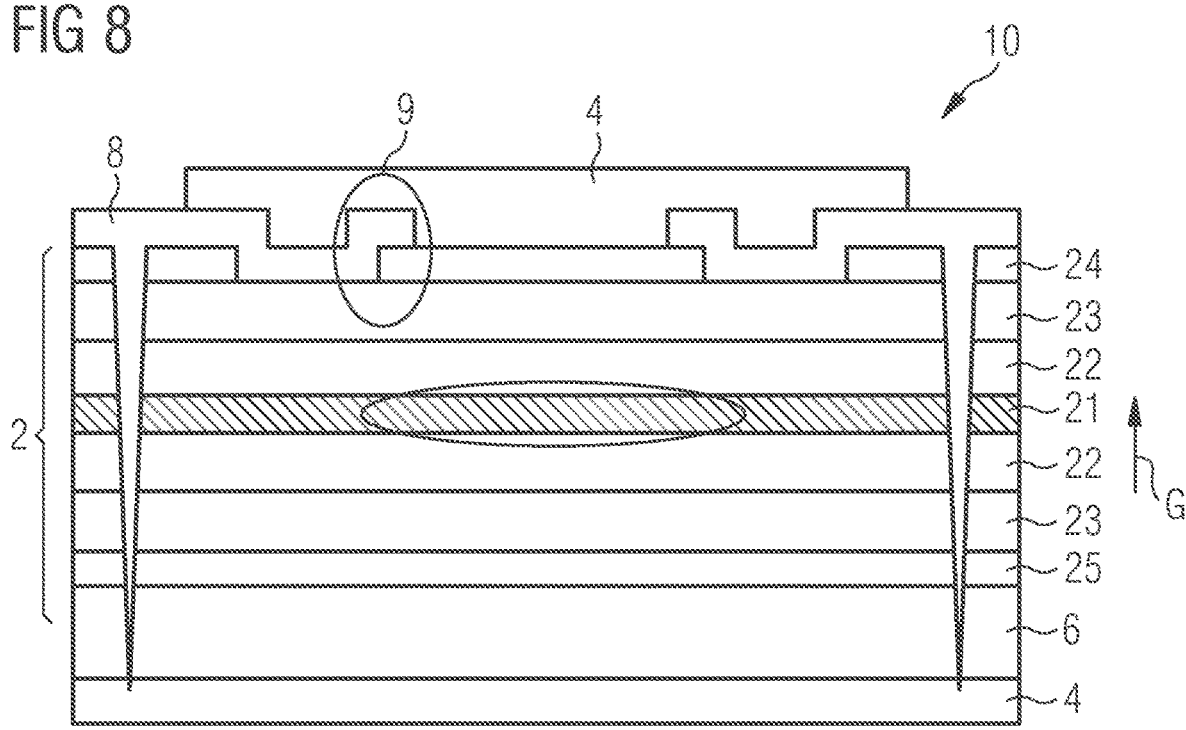

GAIN-GUIDED SEMICONDUCTOR LASER AND METHOD OF MANUFACTURING THE SAME

CROSS-REFERENCE TO RELATED APPLICATIONS

This patent application is a national stage entry from International Application No. PCT/EP2019/074362, filed on Sep. 12, 2019, published as International Publication No. WO 2020/058082 A1 on Mar. 26, 2020, and claims priority under 35 U.S.C. § 119 from German patent application 10 2018 123 019.2, filed Sep. 19, 2018, the entire contents of all of which are incorporated by reference herein.

A gain-guided semiconductor laser is specified. In addition, a method of manufacturing such a semiconductor laser is specified.

The publications WO 01/50553 A2 and WO 02/49168 A2 relate to edge-emitting semiconductor lasers having a ridge waveguide, wherein a current diaphragm layer is brought into the ridge waveguide.

From the publication DE 10 2017 112 242 A1, a gain-guided semiconductor laser is known that comprises strain layers that selectively generate strain in a semiconductor layer sequence.

An object to be solved is to specify a gain-guided semiconductor laser that exhibits a high optical quality of an emitted laser mode.

This object is solved inter alia by a semiconductor laser and by a method of manufacturing having the features of the independent patent claims. Preferred further developments are the subject of the dependent claims.

According to at least one embodiment, the semiconductor laser is a gain-guided semiconductor laser. That is, a mode guiding in the direction transverse to a resonator axis is not performed by refractive index jumps caused, for example, by ridge waveguides or refractive index jumps, but a beam guiding of laser radiation within the semiconductor laser is defined by a current feeding region of an active zone. Thus, a semiconductor layer sequence in the region of the resonator axis, seen in plan view of the semiconductor layer sequence, is geometrically unstructured and formed by continuous layers without inhomogeneities having an optically significant effect.

According to at least one embodiment, the semiconductor laser comprises a semiconductor layer sequence. The semiconductor layer sequence includes at least one active zone for radiation generation and thus for generation of the laser radiation.

Furthermore, the semiconductor layer sequence comprises one or, preferably, two waveguide layers. The at least one waveguide layer is located at the active zone, preferably directly at the active zone. The waveguide layer, in particular together with the active zone, comprises a comparatively high optical refractive index for the laser radiation, so that waveguiding can take place in the waveguide layer in a direction parallel to a growth direction of the semiconductor layer sequence.

Furthermore, the semiconductor layer sequence includes one or, preferably, two cladding layers. The at least one cladding layer is located at the associated waveguide layer. It is possible that at least one cladding layer is located directly at the associated waveguide layer. The at least one cladding layer comprises a comparatively low refractive index compared to the associated waveguide layer to enable waveguiding of the laser radiation.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mN$ or also an arsenide compound semiconductor material such as $Al_nIn_{1-n-m}Ga_mN$ or such as $Al_nGa_mIn_{1-n-m}As_kP_{1-k}$, wherein in each case $0 \leq n \leq 1$, $0 \leq m \leq 1$ and $n+m \leq 1$ as well as $0 \leq k < 1$. Preferably, for at least one layer or for all layers of the semiconductor layer sequence, $0 < n \leq 0.8$, $0.4 \leq m < 1$ and $n+m \leq 0.95$ as well as $0 < k \leq 0.5$. In this context, the semiconductor layer sequence may comprise dopants as well as additional constituents. For simplicity, however, only the essential constituents of the crystal lattice of the semiconductor layer sequence, i.e. Al, As, Ga, In, N or P, are specified, even if these may be partially replaced and/or supplemented by small amounts of additional substances.

Preferably, the semiconductor layer sequence is based on the material system $Al_nIn_{1-n-m}Ga_mAs$, in short AlInGaAs.

According to at least one embodiment, the semiconductor layer sequence further comprises one or more current diaphragm layers. The at least one current diaphragm layer comprises electrically conductive properties along the resonator axis of the semiconductor laser in a central region and electrically insulating properties in edge regions. Thus, in the intended operation of the semiconductor laser, current flows through the current diaphragm layer only in the central region. The current diaphragm layer is thus configured to define a current-fed region of the active zone. Thus, the resonator axis is defined via the current diaphragm layer as well.

According to at least one embodiment, the central region comprises a width of at least 10 μm or 20 μm or 50 μm or, preferably, of at least 100 μm in the transverse direction, in particular in the direction perpendicular to the resonator axis. That is, the central region and thus the current-fed region of the active zone is comparatively wide. The semiconductor laser is thus a broad-stripe laser.

According to at least one embodiment, the edge regions that immediately follow the central region in the direction away from the resonator axis each comprise at least one minimum width. That is, a width of the edge regions may be at the minimum width or the edge regions comprise a width greater than the minimum width.

According to at least one embodiment, the minimum width is at least 3 μm or 5 μm. Alternatively or additionally, the minimum width is at most 100 μm or 50 μm or 20 μm or 10 μm. Preferably, the minimum width is between 5 μm and 10 μm, inclusive.

According to at least one embodiment, the semiconductor layer sequence comprises electrical contact pads. The electrical contact pads are configured for direct current injection into the semiconductor layer sequence. Preferably, the electrical contact pads are composed of one or more metal layers, wherein optionally also layers of a transparent conductive oxide may be present. Preferably, however, the electrical contact pads are metallic structures. In particular, the active zone and especially a current-fed region of the active zone is located between the electrical contact pads.

According to at least one embodiment, the electrical contact pads as well as the semiconductor layer sequence are continuous components in an optically relevant region, as seen in a top view of the semiconductor layer sequence. The optically relevant region, as seen in plan view, is in particular the central region as well as a strip on each side of the central region at least up to the minimum width, extending beyond the central region in the direction transverse to the resonator axis.

This means that in the central region as well as in the strips with a width of at least the minimum width, there are no optically relevant geometric edges and/or structuring. In other words, the semiconductor layer sequence and the electrical contact pads or at least one electrical contact pad directly on the semiconductor layer sequence are flat, unstructured entities across the central region and across strips with at least the minimum width.

The fact that the semiconductor layer sequence and the electrical contact pads in the central region and on both sides beyond it are unstructured and continuous components at least up to the minimum width preferably applies in at least one cross section perpendicular to the resonator axis and parallel to the growth direction of the semiconductor layer sequence. In particular, this applies to all cross sections perpendicular to the resonator axis in a range of at least 80% or 90% of the length of the resonator axis. It is possible to deviate from this geometry at resonator ends, in particular if the electrical contact pad is not present at the resonator ends.

In at least one embodiment, the gain-guided semiconductor laser comprises a semiconductor layer sequence and electrical contact pads. The semiconductor layer sequence comprises an active zone for radiation generation, at least one waveguide layer at the active zone, and at least one cladding layer at the at least one waveguide layer. The semiconductor layer sequence comprises at least one current diaphragm layer that is electrically conductive along a resonator axis of the semiconductor laser in a central region and electrically insulating in adjacent edge regions. Transverse to the resonator axis, the central region comprises a width of at least 10 µm and the edge regions comprise at least a minimum width. The minimum width is 3 µm or more. Seen in plan view, the semiconductor layer sequence as well as at least the electrical contact pad on the semiconductor layer sequence in the central region as well as on both sides at least up to the minimum width in the direction transverse to the resonator axis are continuous components adjoining the central region and extending beyond the central region. In particular, one trench each extends on both sides along the resonator axis and the trenches expose the current diaphragm layer laterally and cut through the entire semiconductor layer sequence as far as a substrate and the trenches are configured in particular to suppress parasitic modes, so that the trenches comprise lateral surfaces running obliquely to a growth direction of the semiconductor layer sequence.

In particular, viewed in plan view, the semiconductor layer sequence and the electrical contact pads in the central region and, at least up to the minimum width in the direction transverse to the resonator axis, on a side of the current diaphragm layer facing away from the active zone are continuous components extending beyond the central region on both sides.

The processing of a current injection, in particular at a p-conducting side of infrared broad stripe lasers, by a structuring, for example, of highly conductive p-GaAs and a subsequent deposition of strained dielectrics and/or metals leads to an increased strain of p-conducting semiconductor layers in the vicinity of structure edges, such as at edges of a structured p-GaAs layer. Since GaAs and AlGaAs become birefringent under pressure and thus under strain, the electro-optical properties of the laser concerned are thus also affected.

On the one hand, this means that a radiation angle in the horizontal plane, i.e. in the direction perpendicular to a growth direction of the semiconductor layer sequence, also referred to as slow axis divergence, is affected. On the other hand, this means that a polarization rotation can occur just below structure edges due to birefringence, and thus laser light at the edge of a broad stripe emitter is increasingly TM-polarized. This is problematic for many applications.

In the gain-guided semiconductor laser described here, which is designed in particular as a broad-stripe laser, structural edges and thus distortions at an current-fed region generating the laser radiation are avoided. Thus, the radiation angle can be controlled in a plane perpendicular to a growth direction of the semiconductor layer sequence and birefringence at edge regions of an current-fed region intended for generating laser radiation can be avoided or at least greatly reduced.

In the semiconductor laser described here, this is achieved in particular by avoiding structural edges at a surface of the semiconductor layer sequence, thus preventing voltage increases at such edges. Furthermore, a gain-guiding of the optical amplification takes place, wherein the width of the current expansion, and thus of the gain-guiding, is essentially independent of the current, which leads to more stable electro-optical properties.

For this purpose, in particular a selectively oxidizable epitaxially grown layer, i.e. the current diaphragm layer, is integrated in the semiconductor layer sequence. Such layers are known, for example, from vertically emitting lasers, but in such lasers they serve to confine an emitting region. In lasers with an index guiding, in particular with ridge waveguides, current confinement layers can serve to achieve single-mode operation.

In lasers with ridge waveguides, however, electrically insulating edge regions of a current diaphragm layer are comparatively narrow, since otherwise index guiding would no longer be ensured due to the ridge waveguide. In contrast, the current diaphragm layer of the semiconductor laser described here comprises a comparatively large width of the edge regions, so that the edge regions are in particular so wide that optical modes supported in the semiconductor laser are shielded by the edge regions from structures lying outside the edge regions.

This means that in semiconductor lasers with ridge waveguides, edge regions of a current diaphragm layer must be so narrow that an optical mode can bridge the electrically insulating edge regions because of the index guiding. In the semiconductor laser described here, exactly the opposite is the case.

According to at least one embodiment, trenches extend along both sides and along the resonator axis. That is, the resonator axis is located between two trenches as seen in plan view. The trenches preferably extend along the complete resonator axis. The current diaphragm layer is exposed laterally by the trenches.

According to at least one embodiment, the trenches cut through the semiconductor layer sequence at least up to the active zone. Likewise, it is possible that the trenches cut through the entire semiconductor layer sequence and extend, for example, up to or even into a substrate, in particular a growth substrate of the semiconductor layer sequence. That is, the active zone may comprise the same width as the current diaphragm layer, and the current diaphragm layer and the active zone may be congruent or substantially congruent when viewed in plan view. Substantially means, for example, with a tolerance of at most 1 µm or 0.5 µm or 0.2 µm. In semiconductor lasers with a ridge waveguide structure, on the other hand, the active zone is typically located below a ridge waveguide and thus comprises a larger width than the ridge waveguide per se.

According to at least one embodiment, the current diaphragm layer is located between the waveguide layer and the associated cladding layer or between one of the waveguide layers and the associated cladding layer. If two current diaphragm layers are present, a corresponding current diaphragm layer may be arranged between each of the associated waveguide layer and the associated cladding layer.

Alternatively, the current diaphragm layer is located in the cladding layer or on a side of the cladding layer facing away from the active zone. Preferably, however, the current diaphragm layer is disposed on a side of the cladding layer facing the active zone. Furthermore, it is possible that the current diaphragm layer is located in the waveguide layer.

According to at least one embodiment, a distance between the current diaphragm layer and the active zone is at least 0.5 µm or 0.8 µm. Alternatively or additionally, this distance is at most 2 µm or 1.5 µm. In particular, the current diaphragm layer is about 1 µm away from the active zone.

According to at least one embodiment, the current diaphragm layer comprises a small thickness. In particular, this means that the thickness of the current diaphragm layer is at least 1 nm or 10 nm or 15 nm. Alternatively or additionally, the thickness of the current diaphragm layer is at most 100 nm or 70 nm or 50 nm.

According to at least one embodiment, the current diaphragm layer is formed of a III-V semiconductor material in the central region. In the edge regions, the current diaphragm layer comprises one or more III oxides, in particular aluminum oxide and/or gallium oxide.

According to at least one embodiment, the current diaphragm layer comprises a different average thickness in the central region than in the edge regions. However, a difference in thickness between the central region and the edge regions is preferably only slight. In particular, this thickness difference is at most 3% or 2% or 1% of the average thickness of the central region. For example, this thickness difference is at least 0.1% or 0.3% of the average thickness of the central region.

According to at least one embodiment, the semiconductor layer sequence is based on the material system AlInGaAs, in particular on AlGaAs, so that no indium is then present. The current diaphragm layer is preferably made of $Al_{1-z}Ga_zAs$ in the central region. Here, z is preferably greater than or equal to 0.005 or greater than or equal to 0.01. Alternatively or additionally, z is at most 0.05 or 0.03 or 0.025. Thus, the current diaphragm layer in the central region is essentially made of AlAs with only a small Ga content.

According to at least one embodiment, layers of the semiconductor layer sequence directly adjacent to the current diaphragm layer comprise an aluminum content of at least 5% or 10% or 20% and/or of at most 60% or 40% or 50%. Such layers adjacent to the semiconductor layer sequence are in particular made of AlInGaAs or of AlGaAs. These layers may constitute the cladding layers and/or the waveguide layers.

According to at least one embodiment, the semiconductor laser comprises facets. The facets are configured to reflect and/or couple out a laser radiation generated during operation. The facets are preferably generated by means of cleavages of the semiconductor layer sequence. It is possible that passivation layers and/or layers for adjusting a reflectivity are present at the facets.

According to at least one embodiment, the facets are free of electrically insulating regions of the current diaphragm layer at least in a radiation coupling-out region. In the radiation coupling-out region, the generated laser radiation exits the facets.

According to at least one embodiment, the edge regions of the current diaphragm layer extend along the resonator axis in the semiconductor layer sequence with a constant width. Alternatively, it is possible that an edge region of the current diaphragm layer is also present at the facets, so that no current is applied to the active zone directly at the facets.

Preferably, however, the facet is free of an electrically insulating region of the current diaphragm layer in the central region, so that any current exemption of the active zone at the facets can be achieved in particular by a geometry of the electrical contact pads.

According to at least one embodiment, a width of the edge regions of the current diaphragm layer is equal to the minimum width. This preferably applies with a tolerance of at most 1 µm or 0.5 µm or 0.2 µm. That is, the electrical contact pads can be laterally flush with the semiconductor layer sequence. The electrical contact pads or at least one of the electrical contact pads directly on the semiconductor layer sequence as well as the semiconductor layers may be congruent or approximately congruent when viewed from above.

According to at least one embodiment, a width of the edge regions is greater than the minimum width. That is, the semiconductor layer sequence is then wider than at least one of the electrical contact pads, in particular wider than the electrical contact pad directly on the semiconductor layer sequence.

According to at least one embodiment, the semiconductor laser comprises exactly one current diaphragm layer. The current diaphragm layer is then preferably located in a p-type region of the semiconductor layer sequence. That is, the current diaphragm layer can be located between the active zone and the electrical contact pad designed as an anode.

According to at least one embodiment, the semiconductor laser comprises exactly two of the current diaphragm layers. The active zone is located between the current diaphragm layers. Thus, one of the current diaphragm layers is located in a p-type region of the semiconductor layer sequence and the other of the current diaphragm layers is located in an n-type region of the semiconductor layer sequence.

According to at least one embodiment, an emission wavelength or maximum intensity wavelength of the laser radiation generated by the semiconductor laser in operation is at least 830 nm or 840 nm and/or at most 1.1 µm or 1060 nm. In other words, the semiconductor laser in operation then emits near-infrared radiation.

According to at least one embodiment, the semiconductor laser is configured for multimode operation.

In conclusion, the combination of a structure edge avoidance and a current-independent current expansion due to the current diaphragm layer enables an improvement of the electro-optical properties of the infrared-emitting gain-guided broad-stripe laser described herein.

In addition, a manufacturing method is specified. The manufacturing method is used to manufacture a semiconductor laser in accordance with one or more of the above embodiments. Features of the manufacturing method are therefore also disclosed for the semiconductor laser, and vice versa.

In at least one embodiment, the method comprises the following steps, preferably in the order indicated:
    epitaxial growth of the semiconductor layer sequence including the current diaphragm layer, forming trenches on both sides along the resonator axis so that the current diaphragm layer is exposed laterally, oxidizing the exposed current diaphragm layer starting from the trenches so that the electrically insulating edge regions are formed and so that the non-oxidized, immediately adjacent regions of the current diaphragm layer form the electrically conducting central region, applying the electrical contact pads, and separating to the semiconductor lasers, in particular by means of scribing and breaking.

According to at least one embodiment, the oxidation of the current diaphragm layer is performed wet-chemically.

According to at least one embodiment, the oxidation of the current diaphragm layer is performed at a temperature of at least 300° C. or 350° C. Alternatively or additionally, this temperature is at most 600° C. or 500° C. or 450° C.

In the following, a semiconductor laser described herein and a manufacturing method described herein are explained in more detail with reference to the drawing by means of exemplary embodiments. Similar reference signs thereby specify similar elements in the individual figures. However, no scale references are shown; rather, individual elements may be shown in exaggerated size for better understanding.

Figure 2:
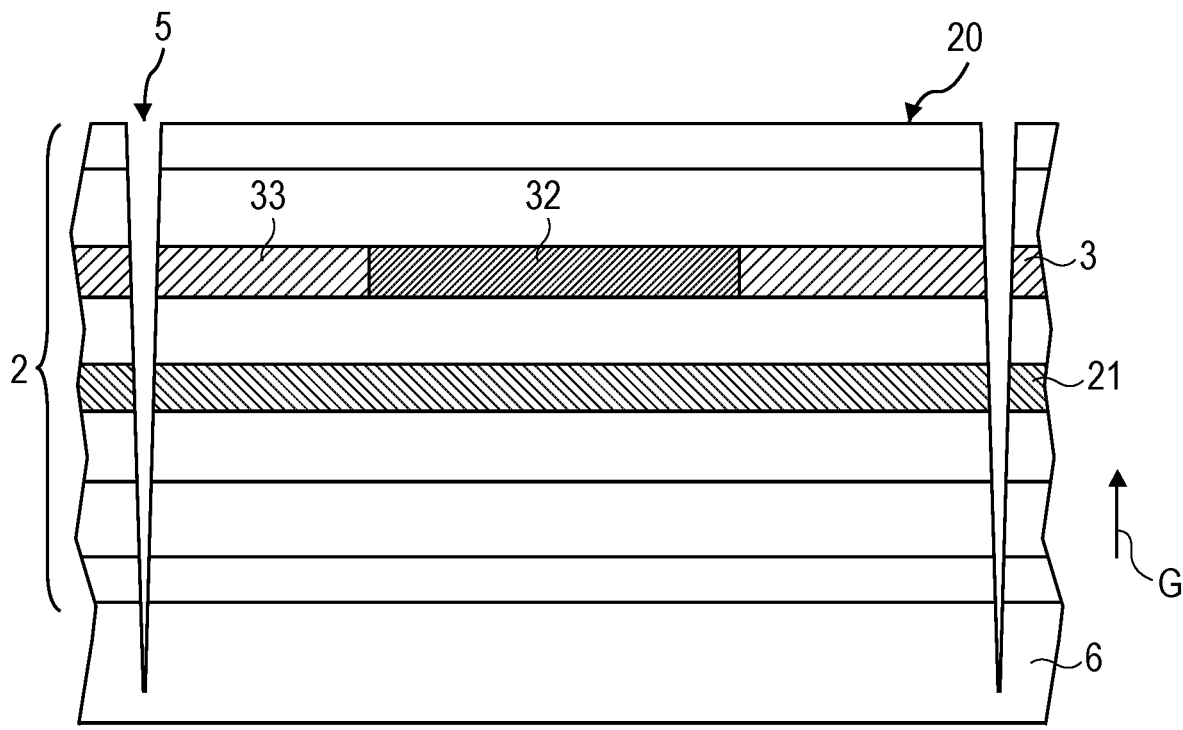
Figure 3:
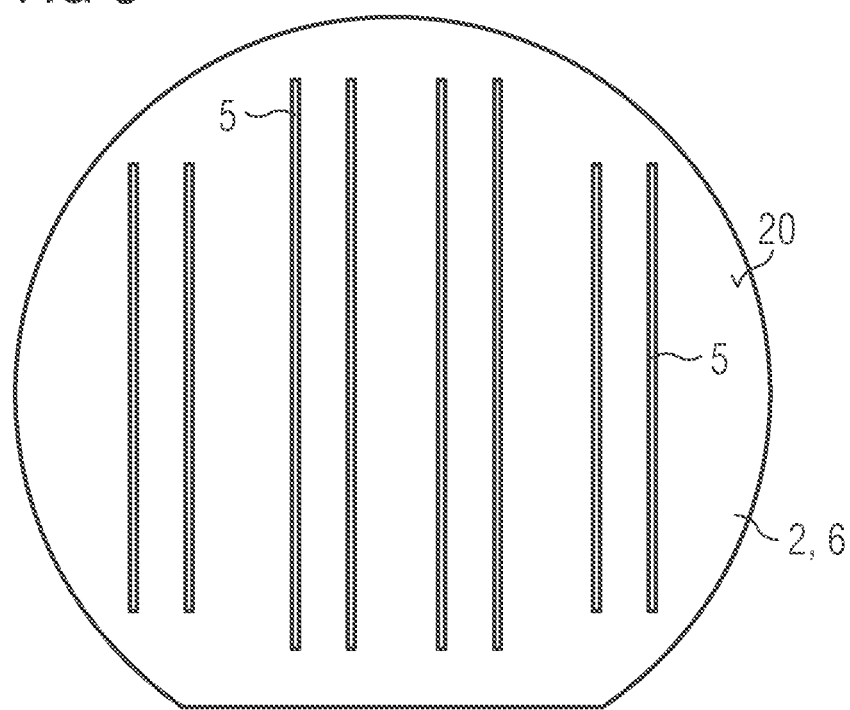
Figure 4:
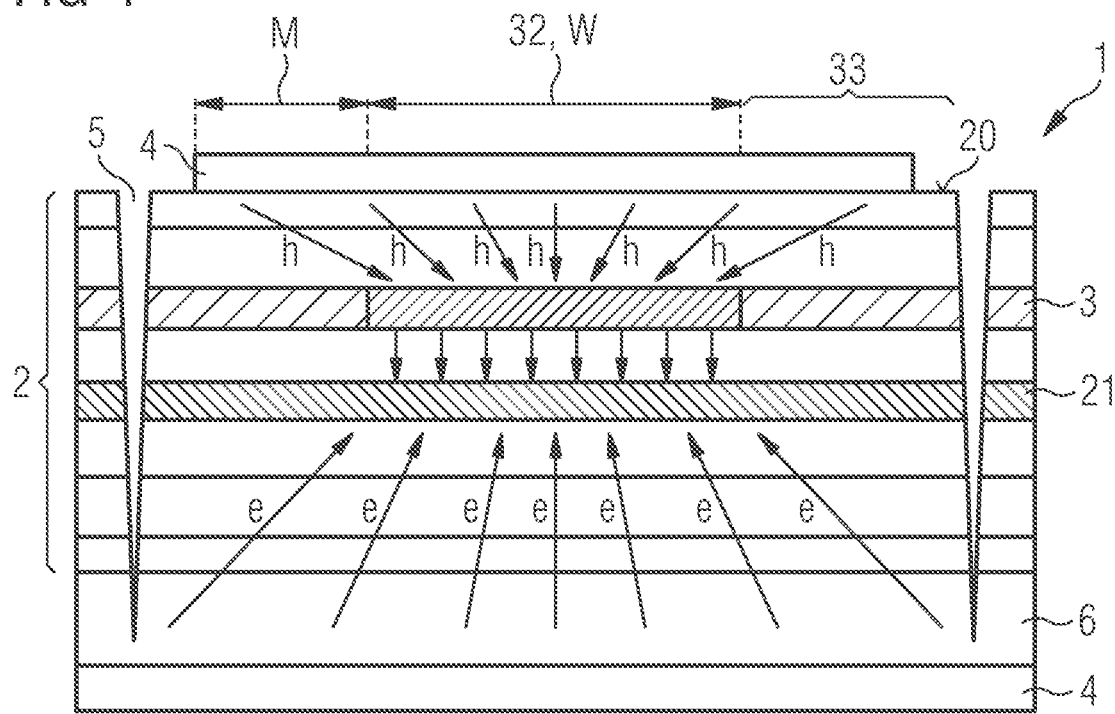
Figure 5:
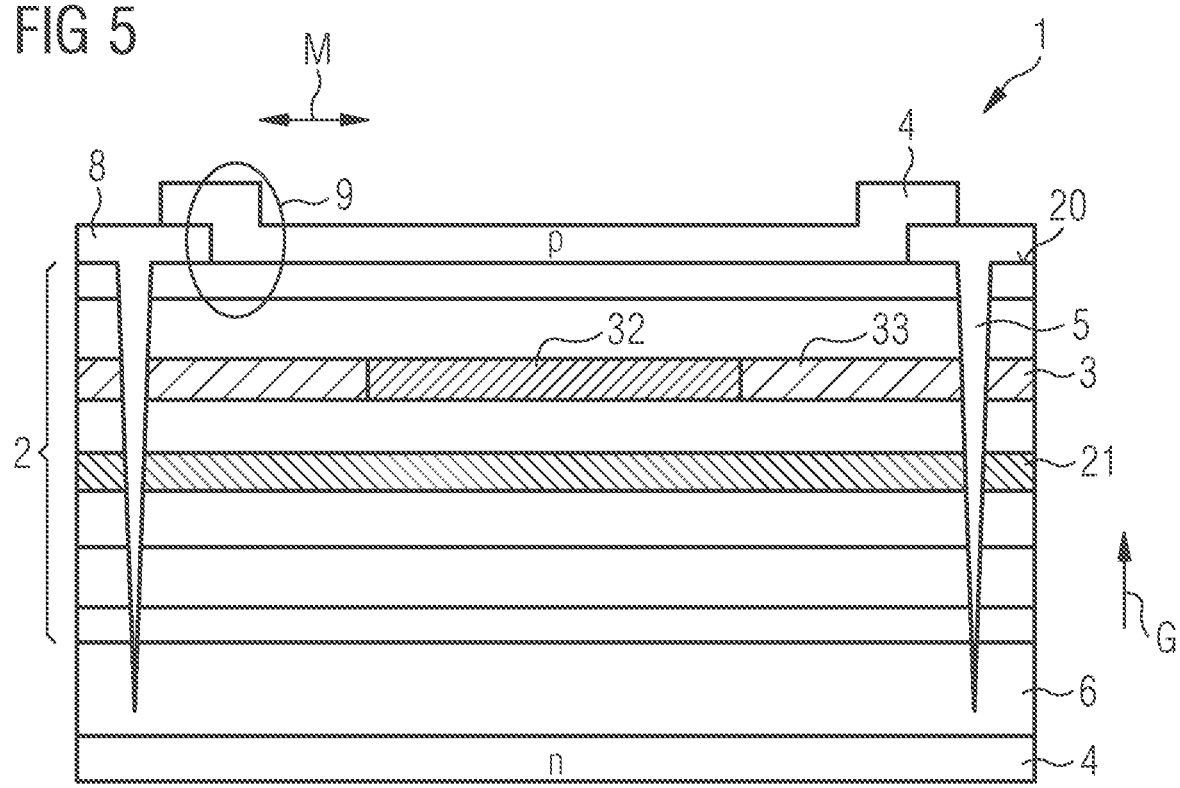
Figure 6:
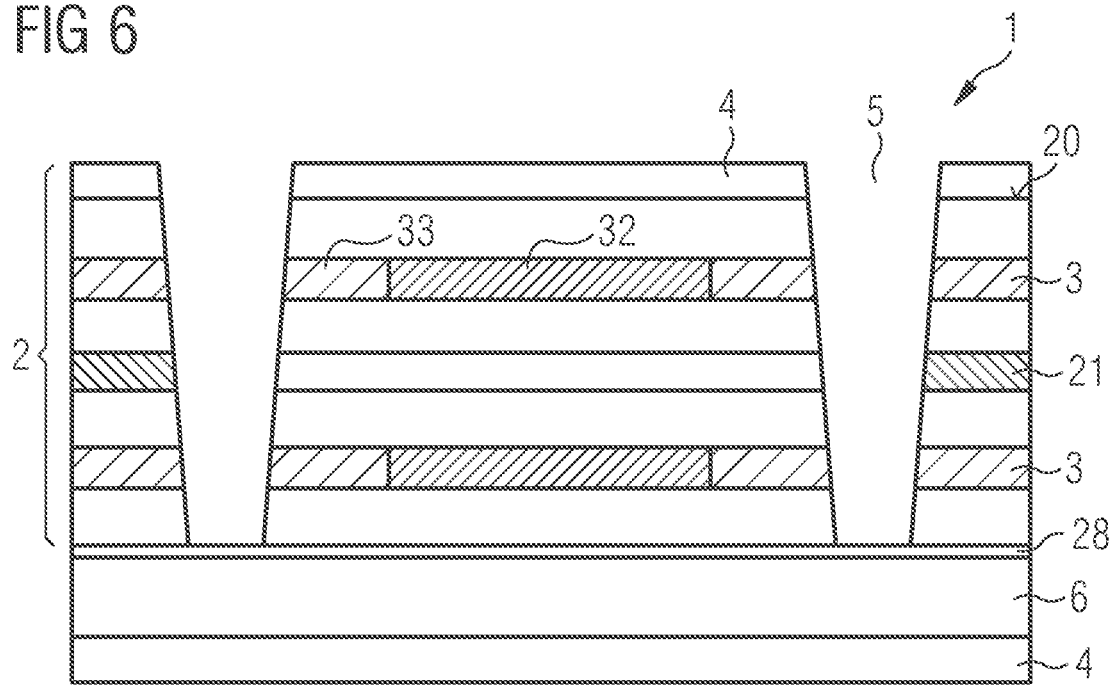

In the figures:

FIG. 1 shows a schematic sectional view of a method step for manufacturing a semiconductor laser described herein, FIG. 2 shows a schematic sectional view of a method step for the production of a semiconductor laser described here, FIG. 3 shows a schematic top view of a method step for manufacturing a semiconductor laser described here, FIG. 4 shows a schematic sectional view of an exemplary embodiment of a semiconductor laser described herein, FIG. 5 shows a schematic sectional view of an exemplary embodiment of a semiconductor laser described herein, FIG. 6 shows a schematic sectional view of an exemplary embodiment of a semiconductor laser described herein, FIG. 7 shows a schematic top view of an exemplary embodiment of a semiconductor laser described herein, and FIG. 8 shows a schematic sectional view of a modification of a semiconductor laser.

FIGS. 1 to 4 illustrate a method of manufacturing a semiconductor laser 1. According to FIG. 1, a semiconductor layer sequence 2 is grown on a substrate 6. The substrate 6 is, for example, an n-doped GaAs substrate. A seed layer 27 is optionally located directly on the substrate 6.

Along a growth direction G, the semiconductor layer sequence 2 comprises a cladding layer 23, a waveguide layer 22, an active zone 21, another waveguide layer 22, and another cladding layer 23. All these layers can be made of AlGaAs and are, for example, n-doped on the substrate side and p-doped in each case on a side facing away from the active zone 21.

Towards the substrate 6 or the optional seed layer 27, the semiconductor layer sequence 2 may comprise a buffer layer 25. The buffer layer 25 is made of n-doped GaAs, for example. Furthermore, the semiconductor layer sequence may comprise a contact layer 24 on a side facing away from the substrate 6.

The contact layer 24 may form an upper side 20 of the semiconductor layer sequence. For example, the contact layer 24 is made of p-doped GaAs, wherein a relatively high dopant concentration may be present.

Furthermore, the semiconductor layer sequence 2 comprises a current diaphragm layer 3. The current diaphragm layer 3 is preferably located between the p-side waveguide layer 22 and the associated cladding layer 23, and is directly adjacent to these layers. Like all other layers of the semiconductor layer sequence 2, the current diaphragm layer 3 is preferably grown as a homogeneous, continuous and unstructured layer across an entire wafer.

For example, the current diaphragm layer 3 is made of p-doped AlGaAs with a Ga content of 2%. That is, the current diaphragm layer 3 is nearly made of AlAs. A thickness of the current diaphragm layer 3 is preferably only small and is in particular around 30 nm. A distance between the current diaphragm layer 3 and the active zone 21, on the other hand, is relatively large and is, for example, about 1 µm.

In the method step of FIG. 2 it is illustrated that trenches 5 are formed through the semiconductor layer sequence 2 into the growth substrate 6. The trenches 5 can be V-shaped as seen in cross-section. Via the trenches 5, the current diaphragm layer 3 grown according to FIG. 1 is exposed laterally, as can also be the case for all other layers of the semiconductor layer sequence 2. A width of the trenches 5 at the upper side 20 is, for example, at least 2 µm or 5 µm and/or at most 20 µm or 10 µm, in particular between 5 µm and 10 µm inclusive.

After the trenches 5 are formed, oxidation of the current diaphragm layer 3 takes place laterally from the trenches 5. This oxidation is preferably carried out wet-chemically at a temperature of, for example, approximately 400° C. The oxidation forms edge regions 33 which extend away from the trenches 5 towards a non-oxidized central region 32. In the central region 32, the current diaphragm layer 3 remains electrically conductive. In the edge regions 33, on the other hand, which are oxidized, the current diaphragm layer 3 is electrically insulating or at least substantially reduced in its electrical conductivity. A transition between the edge regions 33 and the central region 32 in the lateral direction is preferably abrupt.

FIG. 3 shows a top view of the wafer after the method steps of FIG. 2. The trenches 5 preferably extend continuously along later resonator axes of the separated semiconductor lasers 1. The trenches 5 can thus be formed on the wafer by straight, continuous structures across several of the later semiconductor lasers 1. Between adjacent regions of the semiconductor layer sequence 2 for the semiconductor lasers 1 there are thus preferably two of each of the trenches 5.

The trenches 5 are configured in the final semiconductor lasers 1 to suppress parasitic modes such as ring modes. As a result, the trenches 5 preferably comprise side surfaces extending obliquely to the growth direction G in order to reflect radiation not intended for amplification away from the plane of the active zone 21.

In FIG. 4 the finished semiconductor laser 1 is shown, after which electrical contact pads 4 have been applied and after which a singulation to the semiconductor lasers 1 has taken place, e.g. by means of gaps for the generation of facets. As in FIG. 2, a resonator axis is oriented perpendicular to the drawing plane of FIG. 4.

The electrical contact pad 4 on the upper side 20 of the semiconductor layer sequence 2 is applied comparatively broadly across the semiconductor layer sequence 2. Thus, structural edges in the area of the current-fed central region 32 are avoided. Thus, no or no significant distortions of the semiconductor layer sequence 2 occur at the central region 32, which would be caused by structural edges. Thus, a high quality of the optical modes of the emitted laser radiation can be achieved.

A width W of the central region 32 is preferably at least 100 µm and is thus comparatively wide. An unstructured minimum width M adjoining the central region 32 on both sides is preferably between 5 µm and 10 µm inclusive. Thus, the minimum width M is such that optical coupling-out away from the central region 32 occurs over the minimum width M. In other words, the minimum width M is chosen so large that structures outside the minimum width M no longer have any significant optical influence on the guided laser mode.

According to FIG. 4, the edge regions 33 are wider than the minimum width M. This means that the semiconductor layer sequence 2 protrudes over the contact pad 4 on the upper side 20. The contact pad 4 on the substrate 6 is preferably applied over the entire surface or almost the entire surface.

The contact pads 4 are each formed, for example, by a layer stack comprising a plurality of metallic layers. Since the contact pads 4 are applied over a comparatively large area, positive charge carriers h and negative charge carriers e are also impressed over a relatively large area in the direction of the active zone 21. Concentration of the charge carriers e, h occurs due to the current diaphragm layer 3, which is sufficiently electrically conductive only in the central region 32.

In the exemplary embodiment of FIG. 5 it is illustrated that a passivation 8 is additionally applied in the trenches 5. The passivation 8 may cover the semiconductor layer sequence 2 at the upper side 20 in places.

It is possible that the contact pad 4 at the upper side 20 partially extends onto the passivation 8. This results in an edge 9 between the corresponding contact pad 4 and the passivation 8. However, this edge 9 is spaced at least a minimum width M from the central region 32, in the direction perpendicular to the growth direction G and in the direction perpendicular to a resonator axis R which is perpendicular to the drawing plane, not drawn. Strains in the semiconductor layer sequence 2 caused by the edge 9 are thus far enough away from the central region 32 to still exert an influence on the generation of the laser radiation.

Deviating from the illustration in FIG. 5, it is possible that the contact pad 4 on the upper side 20 is flush with the passivation 8 in the lateral direction or that this contact pad 4 ends at a distance from the passivation 8.

In the exemplary embodiment of FIG. 6, it is shown that the semiconductor layer sequence 2 and the contact pad 4 are flush with each other at the upper side 20. The same may also apply in the exemplary embodiments of FIGS. 4 and 5. In addition, the passivation 8 may also optionally be present according to FIG. 6.

Furthermore, it is illustrated in FIG. 6 that optionally another current diaphragm layer 3 may be present. That is, the active zone 21 may be located between the two current diaphragm layers 3.

Seen in cross-section, the trenches 5 can be designed to widen in a trapezoidal shape towards the substrate 6. Furthermore, it is possible that the trenches 5 do not extend into the substrate 6. For this purpose, an etch stop layer 28 can optionally be present in the semiconductor layer sequence 2, for example directly on the substrate 6.

In FIG. 7, a top view of the semiconductor laser 1 is shown. It can be seen that the trenches 5 extend on either side of a resonator axis R. The edge regions 33 start from the trenches 5 and extend with a constant width along the entire resonator axis R and thus directly along the central region 32. The resonator axis R is bounded by facets 7. At one of the facets 7, a laser radiation L generated during operation exits the semiconductor layer sequence 2.

Other than shown in FIG. 7, the contact pad 4 at the upper side 20 can end at a distance from the facets 7 to prevent or reduce a current flow directly at the facets 7.

FIG. 8 illustrates a modification 10 of a semiconductor laser. In this modification 10 there is no current diaphragm layer. A lateral current limitation is achieved by the geometry of the passivation layer 8 and/or the contact layer 4. Thus, the edges 9 are located directly at a current-fed region of the active zone 21, schematically marked by an ellipse in FIG. 8, as seen from the upper side 20. These edges 9 generate stresses in the semiconductor layer sequence 2 directly at the energized region. This can cause a polarization change of the laser radiation at the edges of the energized zone. This is undesirable in many applications.

Due to the subdivision of the current diaphragm layer 3 into the central region 32 as well as the edge regions 33, strains are also induced in the semiconductor layer sequence 2, but due to the small thickness, these strains have only a small, negligible influence.

In addition, the current diaphragm layer 3 is so thin that effectively no index guiding of the laser mode occurs due to the division of the current diaphragm layer 3 into the central region 32 and the edge regions 33, but only pure gain guiding. However, this gain guiding is more stable because the proximity of the current diaphragm layer 3 to the active zone 21 makes current expansion almost independent of a current intensity. Without the current diaphragm layer 3, on the other hand, an increasing widening and enlargement of the current-fed area occurs with increasing current intensity, which affects the emitted laser mode.

Unless otherwise indicated, the components shown in the figures preferably follow one another directly in the sequence indicated. Layers not touching each other in the figures are preferably spaced apart. Insofar as lines are drawn parallel to each other, the corresponding surfaces are preferably also aligned parallel to each other. Also, unless otherwise indicated, the relative positions of the drawn components to each other are correctly reproduced in the figures.

The invention claimed is:

1. A semiconductor laser with a semiconductor layer sequence and with electrical contact pads, wherein
   the semiconductor layer sequence comprises an active zone for radiation generation, at least one waveguide layer at the active zone, and at least one cladding layer,
   the semiconductor layer sequence further comprises at least one current diaphragm layer which comprises electrically conductive material along a resonator axis of the semiconductor laser in a central region and comprises an electrically insulating material in edge regions directly adjoining the central region,
   transversely to the resonator axis the central region comprises a width of at least 10 µm and the edge regions each comprise at least a minimum width
   the minimum width is 3 µm or more, and
   seen in plan view, the semiconductor layer sequence and the electrical contact pads in the central region and at least up to the minimum width in the direction transverse to the resonator axis on a side of the current diaphragm layer facing away from the active zone are continuous components extending on both sides beyond the central region, and
   a trench extends on each side along the resonator axis and the trenches expose the current diaphragm layer laterally and cut through the entire semiconductor layer sequence to a substrate, and the trenches are configured to suppress parasitic modes, so that the trenches comprise side surfaces extending obliquely to a growth direction of the semiconductor layer sequence.

2. The semiconductor laser according to claim 1,
in which the current diaphragm layer is located between the at least one waveguide layer and the at least one cladding layer on a same side of the active zone,
wherein a distance between the current diaphragm layer and the active zone is at least 0.5 μm.

3. The semiconductor laser according to claim 1,
wherein the current diaphragm layer comprises a thickness between 10 nm and 50 nm inclusive.

4. The semiconductor laser according to claim 1,
wherein the current diaphragm layer is formed of a III-V semiconductor material in the central region and comprises at least one of aluminum oxide or gallium oxide in one or more peripheral regions.

5. The semiconductor laser according to claim 1,
wherein the semiconductor layer sequence is based on the material system AlInGaAs,
wherein the current diaphragm layer in the central region is of $Al_{1-z}Ga_zAs$ with $0.01 < z \leq 0.03$.

6. The semiconductor laser according to claim 1,
wherein layers of the semiconductor layer sequence directly adjacent to the current diaphragm layer are of AlGaAs, and an aluminum content in these layers is between 10% and 50% each, inclusive.

7. The semiconductor laser according to claim 1,
in which facets of the semiconductor layer sequence for reflection and/or for coupling-out of a laser radiation generated during operation are free of electrically insulating regions of the current diaphragm layer in a radiation coupling-out region, so that the edge regions of the current diaphragm layer comprise a constant width along the resonator axis.

8. The semiconductor laser according to claim 1,
in which a width of the edge regions of the current diaphragm layer is equal to the minimum width with a tolerance of at most 0.5 μm, so that at least one of the electrical contact pads is laterally flush with the semiconductor layer sequence.

9. The semiconductor laser according to claim 1,
in which a width of the edge regions of the current diaphragm layer is greater than the minimum width, so that the semiconductor layer sequence is wider than at least one of the electrical contact pads.

10. The semiconductor laser according to claim 1,
which comprises exactly one current diaphragm layer,
wherein the current diaphragm layer is located in a p-type region of the semiconductor layer sequence.

11. The semiconductor laser according to claim 1,
which comprises two of the current diaphragm layers,
wherein the active zone is located between the current diaphragm layers.

12. The semiconductor laser according to claim 1,
whose emission wavelength is between 830 nm and 1.1 μm inclusive,
wherein the semiconductor laser is configured for multimode operation.

\* \* \* \* \*